US012693186B2

(12) United States Patent
Paulus et al.

(10) Patent No.: US 12,693,186 B2
(45) Date of Patent: Jul. 28, 2026

(54) SYSTEM AND METHOD FOR DETECTING LEAKS WITH A LEAK DETECTION CABLE

(71) Applicant: THE DETECTION GROUP, INC., North Andover, MA (US)

(72) Inventors: Glen Paulus, San Diego, CA (US); David Wetle, Sunnyvale, CA (US); John Macconnell, El Dorado, CA (US)

(73) Assignee: THE DETECTION GROUP, INC., North Andover, MA (US)

( * ) Notice: Subject to any disclaimer, the term of this patent is extended or adjusted under 35 U.S.C. 154(b) by 298 days.

(21) Appl. No.: 18/635,074

(22) Filed: Apr. 15, 2024

(65) Prior Publication Data

US 2025/0321151 A1 Oct. 16, 2025

(51) Int. Cl.
G01M 3/16 (2006.01)
G01R 19/165 (2006.01)

(52) U.S. Cl.
CPC ....... G01M 3/165 (2013.01); G01R 19/16576 (2013.01)

(58) Field of Classification Search
CPC .......... G01M 3/16; G01M 3/165; G01M 3/18; G01M 3/40; G01M 3/186; G01M 3/045; G01M 3/183; G01R 19/16576; G01R 31/1272; G01R 31/083; G01R 31/387; G01R 31/388; G01R 31/50; G01R 31/52; G01R 31/54; G01R 31/55; G01R 31/28;
(Continued)

(56) References Cited

U.S. PATENT DOCUMENTS

| 3,365,661 A | 1/1968 | Zimmerman |
| 4,319,232 A | 3/1982 | Westphal et al. |

(Continued)

FOREIGN PATENT DOCUMENTS

| JP | 2011191177 A | * | 9/2011 |
| KR | 102187189 B1 | | 12/2020 |

OTHER PUBLICATIONS

Nebylov, A. V., et al. "Research of electrocapacitive sensor for detection of leakages in flow system aboard micro-satellite." IFAC-PapersOnLine 48.9 (2015): 91-96.
(Continued)

*Primary Examiner* — John E Breene
*Assistant Examiner* — Truong D Phan
(74) *Attorney, Agent, or Firm* — Nath, Goldberg & Meyer; Jerald L. Meyer

(57) ABSTRACT

The system for detecting leaks with a leak detection cable includes a leak detection cable having first and second conductive elements, such as wires or the like, where each of the first and second conductive elements has opposed first and second ends, and where a diode electrically connects the first ends of the first and second conductive elements. A closed circuit is formed by the first and second conductive elements, the diode, testing circuitry and a controller. The closed circuit allows for the determination of whether the leak detection cable has become disconnected. The testing circuitry includes a first capacitor in electrical communication with the second end of the first conductive element, and a second capacitor in electrical communication with the second end of the second conductive element. The controller determines the polarity of the diode and whether a leak is detected by the leak detection cable.

16 Claims, 4 Drawing Sheets

(58) Field of Classification Search
CPC ........ G01R 19/16504; G01R 19/16528; G01R
19/16533; G01R 31/08; E04D 13/006
USPC ............................................ 73/40, 598, 600
See application file for complete search history.

(56) References Cited

U.S. PATENT DOCUMENTS

| | | |
|---|---|---|
| 5,235,286 A | 8/1993 | Masia et al. |
| 6,144,209 A | 11/2000 | Raymond et al. |
| 2021/0262887 A1 | 8/2021 | Okazaki |

OTHER PUBLICATIONS

Marian, P. "Simple Water Detector Circuit." Oct. 22, 2011.
The Detection Group Leak Sensing Cable DTSC-100; Apr. 13, 2020.

* cited by examiner

SYSTEM AND METHOD FOR DETECTING LEAKS WITH A LEAK DETECTION CABLE

BACKGROUND

Field

The disclosure of the present patent application relates to the detection of leaks, and particularly to the usage of a leak detection cable to detect leaks where disconnection of, or damage to, the leak detection cable can be detected.

Description of Related Art

FIGS. 4 and 5 illustrate a conventional braided leak detection cable 100 for detecting water leaks, as well as leaks of other types of fluid. Such cables typically include a pair of elongated conductive elements 102 and 104, such as conductive wires, and an elongated, non-conductive flexible base member 106 having two opposite side edges with grooves or recessed areas 108 for receiving the two elongated conductive elements 102, 104. The two conductive elements 102, 104 are typically coated along their lengths with a non-conductive, water-insoluble liquid-pervious coating 110. The base member 106 is often twisted to provide the braided cable 100 shown in FIG. 4.

The conductive elements 102 and 104 are positioned respectively in the recessed areas 108 on opposite side edges of the base member 106. The depth of each recessed area 108 is greater than the diameter of each conductive element 102, 104 so that the conductive elements 102, 104 do not touch any possibly conductive objects when the cable 100 is positioned on a surface to detect leaks.

In use, one end of each of the conductive elements 102, 104 is connected to a control system and the opposite end is typically free or unconnected; i.e., each of the conductive elements 102, 104 typically has a free end which is not electrically connected to any other component, including the other one of the conductive elements. Thus, in dry conditions, the control system and the conductive elements 102, 104 form an open circuit. A closed circuit is created when water (or another conductive fluid) is absorbed through the liquid-pervious coating 110 surrounding the conductive elements 102, 104.

A typical control system used with this type of leak detecting cable may be, for example, a DC wheat-stone bridge circuit to determine the direct voltage drop across the conductive elements 102 and 104 at the point of contact with the conductive liquid. As another example, a constant DC current sensing system may be used to measure the drop of voltage at the point of contact with the conductive liquid. A further typical example of a control system used with this type of leak detecting cable is a 1 Hz alternating AC signal-generating system that determines the voltage differential between the standard wave form when compared with the wave form which is returned when a parallel resistance path is generated when the liquid contacts the conductive elements 102, 104. In addition to detecting the presence of a leak, the location of the leak with respect to conductive elements 102, 104 can be determined when the electrical resistance of the conductive elements 102, 104 is known.

Since leak detection cables like leak detection cable 100 are, essentially, open circuits until a conductive liquid is absorbed by the coating layer, it is impossible to determine electronically if the leak detection cable is disconnected or has become damaged in some way. Although the leak detection cable 100 could be modified to add, for example, two additional wires specifically for sensing a connected or disconnected state, this would not only require modification of the control system but would also require those additional wires to be specially insulated and arranged so that they cannot interfere with the leak-detecting capability of the conductive elements 102 and 104. Being able to detect a disconnection of the leak detection cable without having to excessively modify the structure of the cable would be advantageous. Thus, a system and method for detecting leaks with a leak detection cable solving the aforementioned problems are desired.

SUMMARY

The system for detecting leaks with a leak detection cable includes a leak detection cable having first and second conductive elements, such as wires or the like, where each of the first and second conductive elements has opposed first and second ends, and where a diode electrically connects the first ends of the first and second conductive elements. Thus, in contrast with a conventional leak detection cable, where the corresponding first ends of the conductive elements are free and form an open circuit, a closed circuit is formed by the first and second conductive elements, the diode, testing circuitry and a controller. The closed circuit allows for the determination of whether the leak detection cable has become disconnected. Similar to a conventional leak detection cable, each of the first and second conductive elements may be covered with an electrically insulating and liquid absorbent material.

The testing circuitry includes a first capacitor in electrical communication with the second end of the first conductive element, and a second capacitor in electrical communication with the second end of the second conductive element. Since the diode can be installed in one of two polarities, which will affect the operation of the testing circuitry, the controller determines the polarity of the diode and then determines whether a leak is detected by the leak detection cable taking the polarity of the diode into account. The controller also detects a disconnection of, or damage to, the leak detection cable.

In use, the controller is configured to perform the following operational processes:

a) electrically charge the second capacitor;

b) measure a first voltage from the first conductive element;

c) determine that the diode has a first polarity and that the leak detection cable is connected when the measured first voltage from the first conductive element is greater than a first threshold voltage;

d) charge the first capacitor and subsequently measure a second voltage from the second conductive element when the diode is determined not to have the first polarity;

e) determine that the diode has a second polarity and that the leak detection cable is connected when the measured second voltage from the second conductive element is greater than the first threshold voltage when the diode is determined not to have the first polarity;

f) determine that the leak detection cable is disconnected when the measured first and second voltages from the first and second conductive elements, respectively, are each less than the first threshold voltage;

g) electrically charge the first capacitor when the diode is determined to have the first polarity and the leak detection cable is determined to be connected;

h) measure a third voltage from the first conductive element when the diode is determined to have the first polarity and the leak detection cable is determined to be connected;

i) determine that a leak exists when the measured third voltage from the first conductive element indicates that the first capacitor has discharged when the diode is determined to have the first polarity and the leak detection cable is determined to be connected;

j) electrically charge the second capacitor when the diode is determined to have the second polarity and the leak detection cable is determined to be connected;

k) measure a fourth voltage from the second conductive element when the diode is determined to have the second polarity and the leak detection cable is determined to be connected; and l) determine that a leak exists when the measured fourth voltage from the second conductive element indicates that the second capacitor has discharged when the diode is determined to have the second polarity and the leak detection cable is determined to be connected.

Following operational process l) above, the operations performed by the controller may then return to process a), allowing for continuous leak detection and continuous monitoring for disconnection of, or damage to, the leak detection cable. Additionally, the controller is further configured to generate a disconnection signal when the leak detection cable is determined to be disconnected in process f) above. Depending on the detected polarity of the diode, the controller may generate a leak detection signal when the measured third voltage from the first conductive element indicates that the first capacitor has discharged in process i), or when the measured fourth voltage from the second conductive element indicates that the second capacitor has discharged in process l).

In process i) above, the controller may determine that the first capacitor has discharged when the measured third voltage is lower than a second threshold voltage. Similarly, for the opposite polarity of the diode, in process l) above, the controller may determine that the second capacitor has discharged when the measured fourth voltage is lower than a second threshold voltage.

These and other features of the present subject matter will become readily apparent upon further review of the following specification.

BRIEF DESCRIPTION OF DRAWINGS

Similar reference characters denote corresponding features consistently throughout the attached drawings.

DETAILED DESCRIPTION

Figure 1:
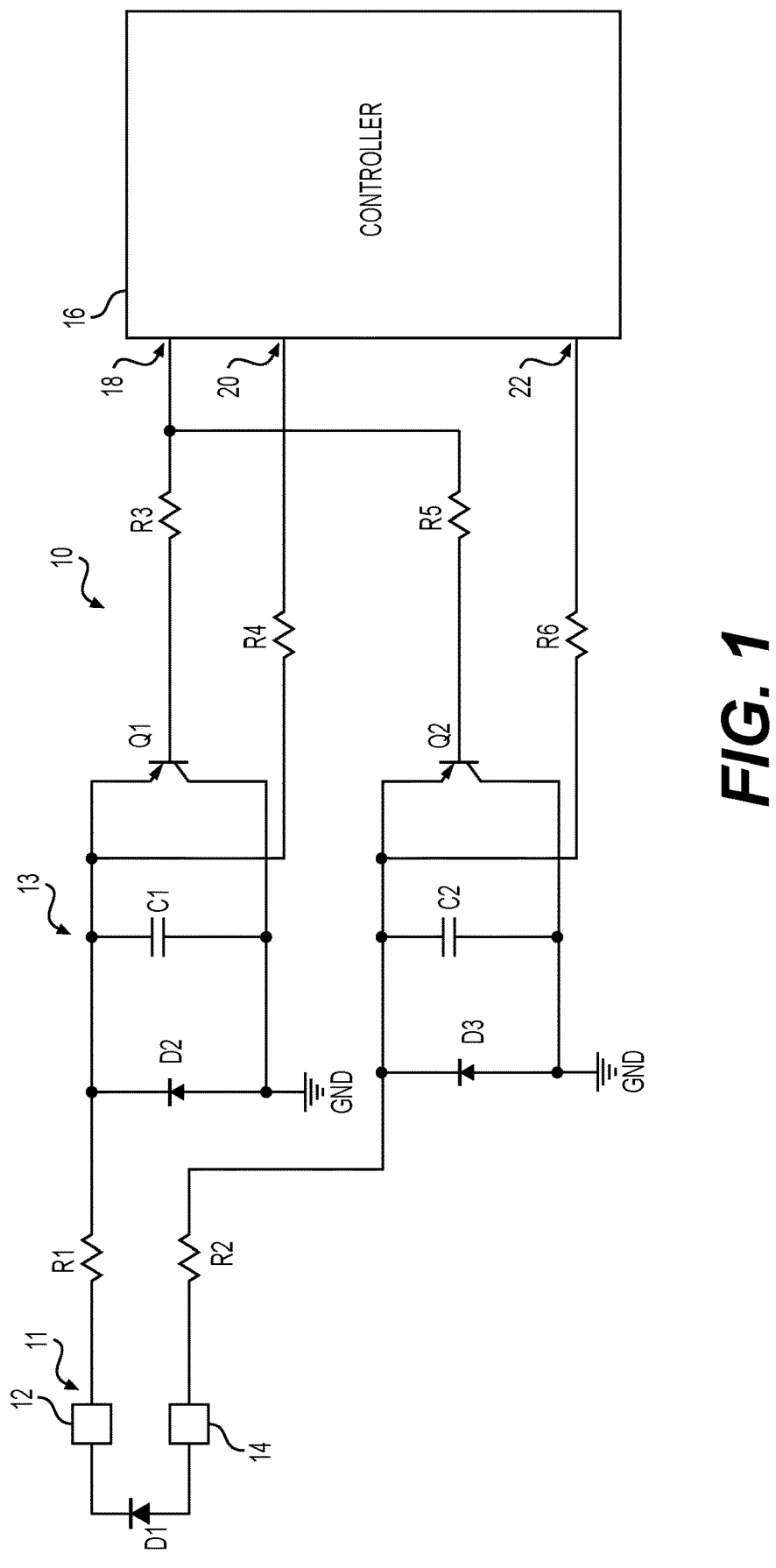
FIG. 1 is a schematic diagram of the system for detecting leaks with a leak detection cable, showing a diode thereof installed with a first polarity.
Figure 2:
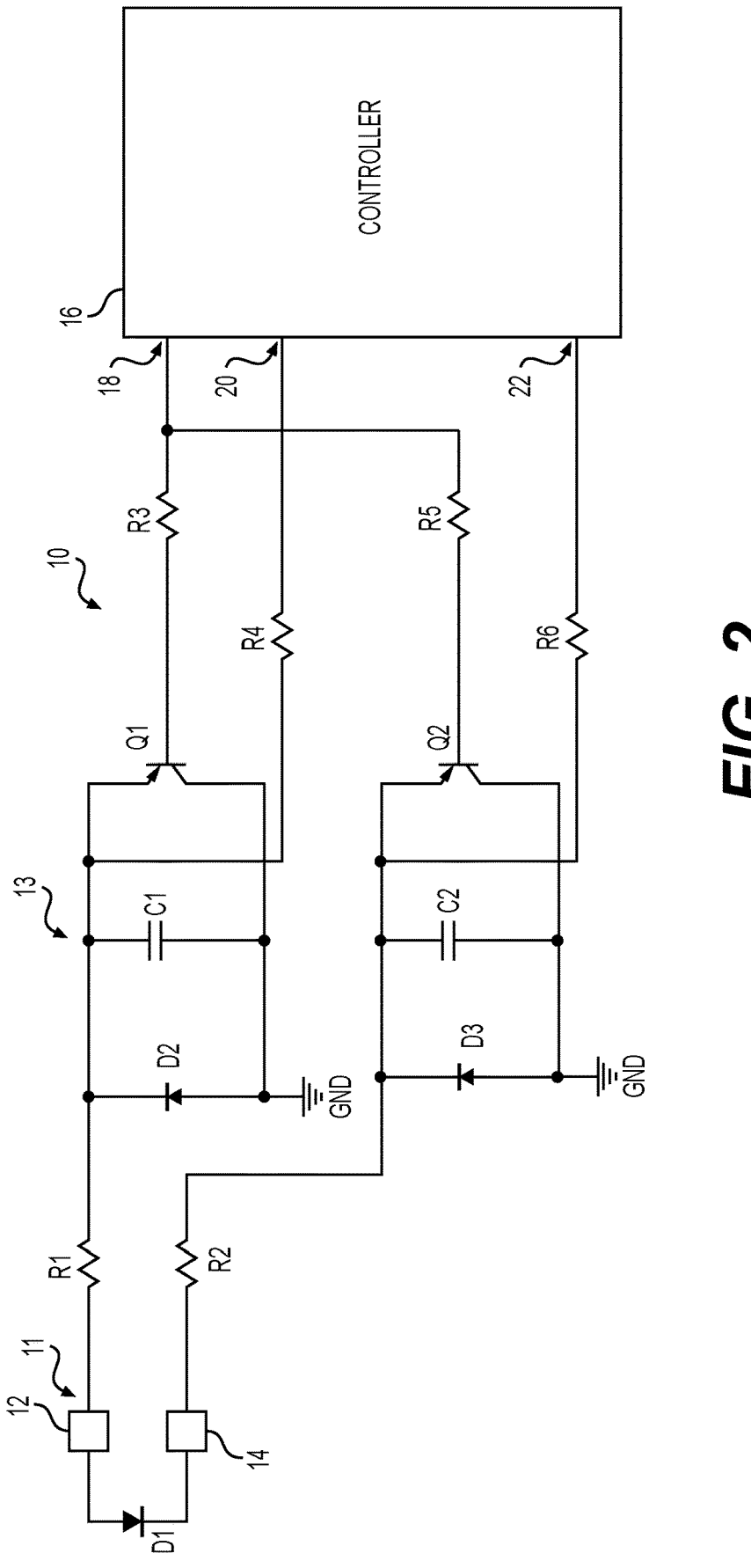
FIG. 2 is a schematic diagram of the system for detecting leaks with a leak detection cable, showing the diode installed with a second opposite polarity.

As shown in FIGS. 1 and 2, the system 10 for detecting leaks with a leak detection cable includes a leak detection cable having first and second conductive elements 12, 14, such as wires or the like, where each of the first and second conductive elements 12, 14 has opposed first and second ends, and where a diode D1 electrically connects the first ends of the first and second conductive elements 12, 14. Although first and second conductive elements 12, 14 may be similar to wires 102, 104 of leak detection cable 100 (discussed above with regard to FIGS. 4 and 5), including a similar type of non-conductive, water-insoluble liquid-pervious coating and base member, in contrast with leak detection cable 100, in which the corresponding first ends of the conductive elements 102, 104 are free and form an open circuit, a closed circuit is formed by the first and second conductive elements 12, 14, the diode D1, testing circuitry 13 and a controller 16. This closed circuit allows for the determination of whether the leak detection cable 11 has become disconnected.

Figure 4:
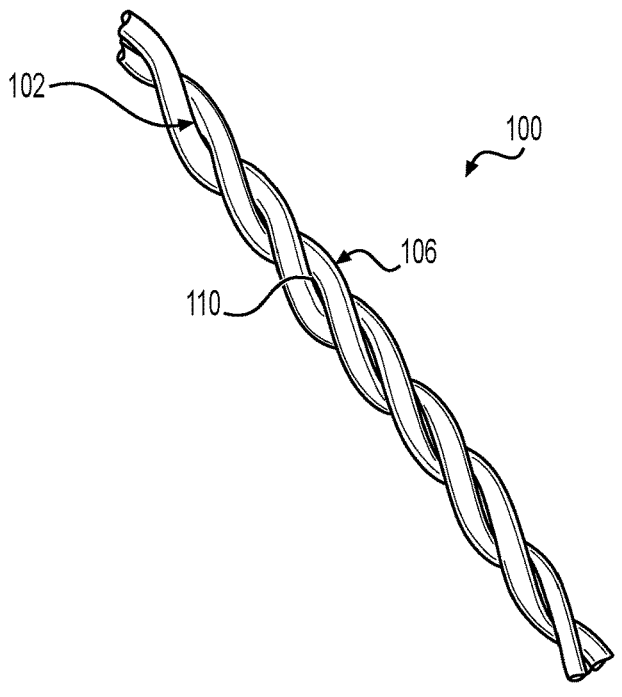
FIG. 4 is a partial perspective view of a conventional leak detection cable.
Figure 5:
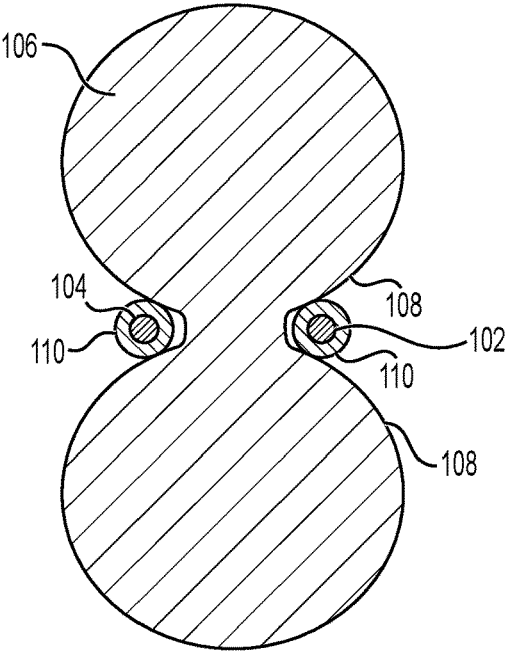
FIG. 5 is a sectional view of the conventional leak detection cable of FIG. 4.

It should be understood that, similar to a conventional leak detection cable, such as leak detection cable 100 shown in FIGS. 4 and 5, each of the first and second conductive elements 12, 14 may be covered with any suitable type of electrically insulating and liquid absorbent material. It should be further understood that the leak detection cable 11 may be similarly constructed to a conventional leak detection cable, such as that discussed above with regard to FIGS. 4 and 5, but with the diode D1 electrically connecting the first ends of the first and second conductive elements 12, 14.

The testing circuitry 13 includes a first capacitor C1 in electrical communication with the second end of the first conductive element 12 (with resistor R1 therebetween), and a second capacitor C2 in electrical communication with the second end of the second conductive element 14 (with resistor R2 therebetween). As shown in FIGS. 1 and 2, first capacitor C1 may also be connected in parallel with a diode D2 (which may be connected to ground, as shown), and second capacitor C2 may be connected in parallel with a diode D3 (which may be connected to ground, as shown). Since the diode D1 can be installed in one of two polarities, which will affect the operation of the testing circuitry 13, the controller 16 determines the polarity of diode D1 and then determines whether a leak is detected by the leak detection cable 11, taking the polarity of diode D1 into account. The controller 16 also detects a disconnection of, or damage to, the leak detection cable 11.

As further shown in FIGS. 1 and 2, the first capacitor C1 may also be connected in parallel with first transistor Q1, which is connected with first connection 18 of controller 16, with resistor R3 therebetween. A second connection 20 of controller 16 is connected with the upper branch of testing circuitry 13, with resistor R4 therebetween. The second capacitor C2 may also be connected in parallel with second transistor Q2, which is connected with first connection 18 of controller 16, with resistor R5 therebetween. The third connection 22 of controller 16 is connected with the lower branch of testing circuitry 13, with resistor R6 therebetween.

It should be understood that controller 16 may be any suitable type of controller, such as a processor, a programmable logic controller, a computer or the like. As a non-limiting example, controller 16 may be a microprocessor or control chip, and connections 18, 20 and 22 may be pins thereof.

Figure 3:
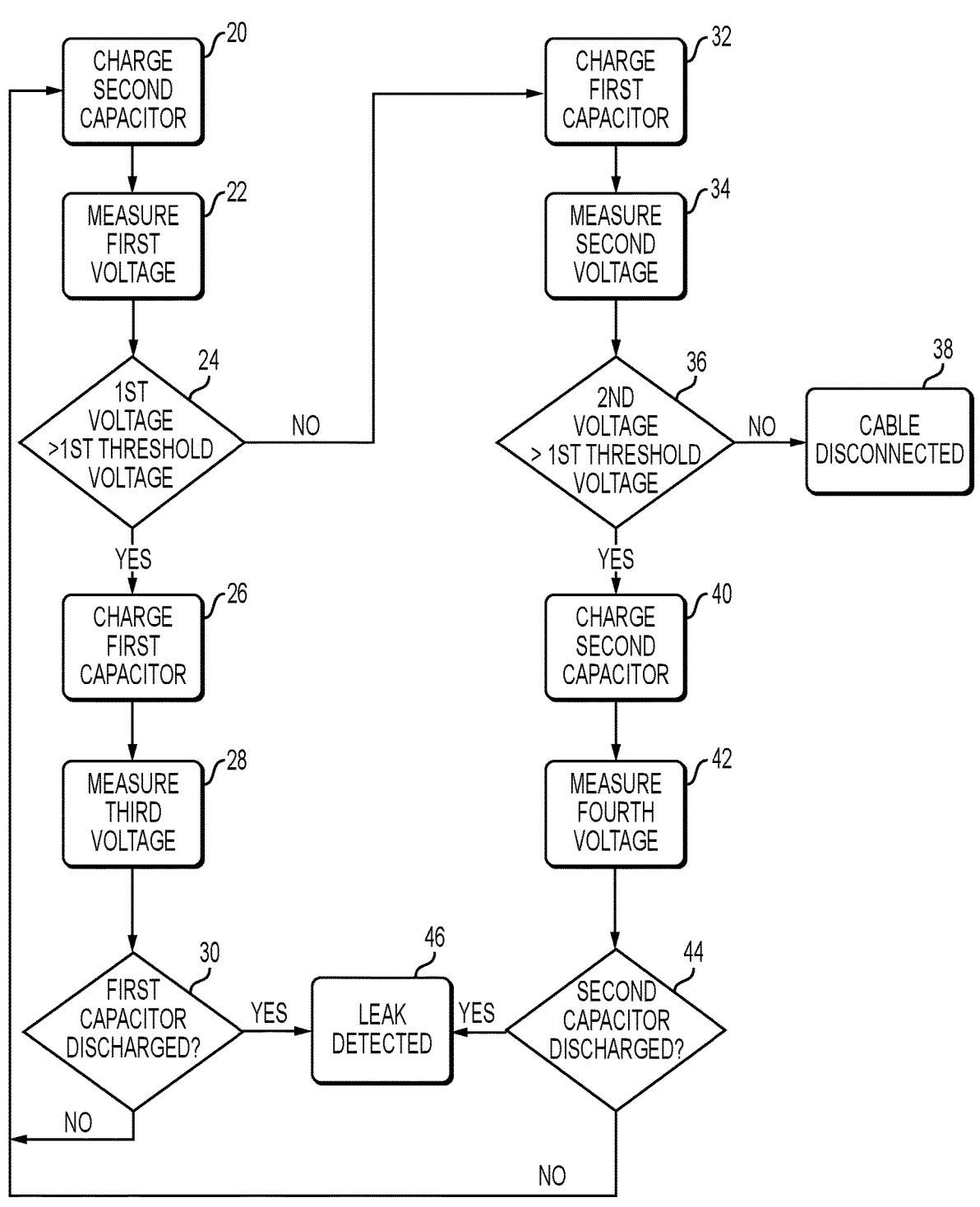
FIG. 3 is a flowchart illustrating process steps of the method for detecting leaks with a leak detection cable.

In use, the controller 16 is configured to perform the following operational processes:

a) electrically charge the second capacitor C2 (step 20 in FIG. 3);

b) measure a first voltage from the first conductive element 12 (step 22);

c) determine that the diode D1 has a first polarity and that the leak detection cable 11 is connected when the measured first voltage from the first conductive element 12 is greater than a first threshold voltage (step 24);

d) charge the first capacitor C1 and subsequently measure a second voltage from the second conductive element 14 when the diode D1 is determined not to have the first polarity (steps 32 and 34);

e) determine that the diode D1 has a second (opposite) polarity and that the leak detection cable 11 is connected when the measured second voltage from the second conductive element 14 is greater than the first threshold voltage when the diode D1 is determined not to have the first polarity (step 36);

f) determine that the leak detection cable 11 is disconnected when the measured first and second voltages from the first and second conductive elements 12, 14, respectively, are each less than the first threshold voltage (steps 24, 36 and 38);

g) electrically charge the first capacitor C1 when the diode D1 is determined to have the first polarity and the leak detection cable 11 is determined to be connected (step 26);

h) measure a third voltage from the first conductive element 12 when the diode D1 is determined to have the first polarity and the leak detection cable 11 is determined to be connected (step 28);

i) determine that a leak exists when the measured third voltage from the first conductive element 12 indicates that the first capacitor C1 has discharged when the diode D1 is determined to have the first polarity and the leak detection cable 11 is determined to be connected (steps 30 and 46);

j) electrically charge the second capacitor C2 when the diode D1 is determined to have the second polarity and the leak detection cable 11 is determined to be connected (step 40);

k) measure a fourth voltage from the second conductive element 14 when the diode D1 is determined to have the second polarity and the leak detection cable 11 is determined to be connected (step 42); and l) determine that a leak exists when the measured fourth voltage from the second conductive element 14 indicates that the second capacitor C2 has discharged when the diode D1 is determined to have the second polarity and the leak detection cable 11 is determined to be connected (steps 44 and 46).

Following operational process l) above, the operations performed by the controller 16 may then return to process a), allowing for continuous leak detection and continuous monitoring for disconnection of, or damage to, the leak detection cable. Additionally, the controller 16 is further configured to generate a disconnection signal when the leak detection cable 11 is determined to be disconnected in process f) above. Depending on the detected polarity of the diode D1, the controller 16 may generate a leak detection signal when the measured third voltage from the first conductive element 12 indicates that the first capacitor C1 has discharged in process i), or when the measured fourth voltage from the second conductive element 14 indicates that the second capacitor C2 has discharged in process l).

In process i) above, the controller 16 may determine that the first capacitor C1 has discharged when the measured third voltage is lower than a second threshold voltage. Similarly, for the opposite polarity of the diode D1, in process l) above, the controller 16 may determine that the second capacitor C2 has discharged when the measured fourth voltage is lower than a second threshold voltage.

FIG. 1 shows diode D1 with the first polarity and FIG. 2 shows diode D1 with the second (opposite) polarity. During the testing phase to determine the polarity of diode D1, in the configuration of FIG. 1, first connection 18 of controller 16 acts as an output and is set "high" for the duration of the polarity test. Third connection 22 is also configured as an output and is also set "high" to charge the second capacitor C2 (step 20 in FIG. 3 and process a) above). The second connection 20 is set as an input. If the first voltage measured through second connection 20 is greater than the first threshold voltage (step 24 in FIG. 3 and process c) above), then controller 16 determines that leak detection cable 11 is present and that diode D1 has the first polarity (i.e., the configuration shown in FIG. 1).

When the diode has the second (opposite) polarity of FIG. 2, during the testing phase to determine the polarity of diode D1, first connection 18 of controller 16 also acts as an output and is set "high" for the duration of the polarity test. Second connection 20 is also configured as an output and is also set "high" to charge the first capacitor C1 (step 32 in FIG. 3 and process g) above). The third connection 22 is set as an input. If the second voltage measured through third connection 22 is greater than the first threshold voltage (step 36 in FIG. 3 and process e) above), then controller 16 determines that leak detection cable 11 is present and that diode D1 has the second polarity (i.e., the configuration shown in FIG. 2).

Once the polarity testing phase is completed and controller 16 has determined the polarity of diode D1, for the first polarity of FIG. 1, first connection 18 is set as an output and is always "high" for the duration of the leak detection. Second connection 20 is also configured as an output and is set "high" to charge first capacitor C1 (step 26 in FIG. 3 and process g) above). Third connection 22 is configured as an output and is set "low". After first capacitor C1 is charged, second connection 20 is configured as an input. If there is a leak, second connection 20 detects a voltage lower than a second threshold voltage, indicating discharge of first capacitor C1 (steps 30 and 46 of FIG. 3 and process i) above) and, thus, the presence of a leak. First connection 18 and second connection 20 are then configured as outputs and set "low".

If controller 16 determines the polarity of diode D1 is the second polarity of FIG. 2, first connection 18 is also set as an output and is always "high" for the duration of the leak detection. Third connection 22 is also configured as an output and is set "high" to charge second capacitor C2 (step 40 of FIG. 3 and process j) above). Second connection 20 is configured as an output and is set "low". After second capacitor C2 is charged, third connection 22 is configured as an input. If there is a leak, third connection 22 detects a voltage lower than a second threshold voltage, indicating discharge of second capacitor C2 (steps 44 and 46 of FIG. 3 and process l) above) and, thus, the presence of a leak. First connection 18 and third connection 22 are then configured as outputs and set "low".

In FIGS. 1 and 2, non-limiting examples of component parameters include resistances of resistors R1 and R2 of 10 kΩ each, and resistances of resistors R3, R4, R5 and R6 of 10 kΩ each. Further non-limiting examples include capacitances of 10 nF for each of first and second capacitors C1 and C2. As a further non-limiting example, first and second transistors Q1 and Q2 may each be a bipolar junction transistor (BJT) (PNP 60 V; 600 mA; 200 MHz; 300 mW), and each of diodes D2 and D3 may be a 200 V, 200 mA surface mount diode. For these non-limiting exemplary parameters, with a charged potential difference of 3.3 V across each of first and second capacitors C1 and C2, the first threshold voltage of steps 24 and 36 (FIG. 3) could be, as a further non-limiting example, 1.5 V.

It is to be understood that the system and method for detecting leaks with a leak detection cable are not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

The invention claimed is:

1. A system for detecting leaks, comprising:
a leak detection cable having first and second conductive elements, wherein each of the first and second conductive elements has opposed first and second ends, and wherein a diode electrically connects the first ends of the first and second conductive elements;
testing circuitry comprising a first capacitor in electrical communication with the second end of the first conductive element, and a second capacitor in electrical communication with the second end of the second conductive element;
a controller configured to perform following steps:
a) electrically charge the second capacitor;
b) measure a first voltage from the first conductive element;
c) determine that the diode has a first polarity and that the leak detection cable is connected when the measured first voltage from the first conductive element is greater than a first threshold voltage;
d) charge the first capacitor and subsequently measure a second voltage from the second conductive element when the diode is determined not to have the first polarity;
e) determine that the diode has a second polarity and that the leak detection cable is connected when the measured second voltage from the second conductive element is greater than the first threshold voltage when the diode is determined not to have the first polarity;
f) determine that the leak detection cable is disconnected when the measured first and second voltages from the first and second conductive elements, respectively, are each less than the first threshold voltage;
g) electrically charge the first capacitor when the diode is determined to have the first polarity and the leak detection cable is determined to be connected;
h) measure a third voltage from the first conductive element when the diode is determined to have the first polarity and the leak detection cable is determined to be connected;
i) determine that a leak exists when the measured third voltage from the first conductive element indicates that the first capacitor has discharged when the diode is determined to have the first polarity and the leak detection cable is determined to be connected;
j) electrically charge the second capacitor when the diode is determined to have the second polarity and the leak detection cable is determined to be connected;
k) measure a fourth voltage from the second conductive element when the diode is determined to have the second polarity and the leak detection cable is determined to be connected; and
l) determine that a leak exists when the measured fourth voltage from the second conductive element indicates that the second capacitor has discharged when the diode is determined to have the second polarity and the leak detection cable is determined to be connected.

2. The system for detecting leaks as recited in claim 1, further comprising the step of generating a disconnection signal when the leak detection cable is determined to be disconnected in step f).

3. The system for detecting leaks as recited in claim 2, further comprising the step of generating a leak detection signal when the measured third voltage from the first conductive element indicates that the first capacitor has discharged in step i).

4. The system for detecting leaks as recited in claim 2, further comprising the step of generating a leak detection signal when the measured fourth voltage from the second conductive element indicates that the second capacitor has discharged in step l).

5. The system for detecting leaks as recited in claim 1, wherein it is determined that the first capacitor has discharged in step i) when the measured third voltage is lower than a second threshold voltage.

6. The system for detecting leaks as recited in claim 1, wherein it is determined that the second capacitor has discharged in step l) when the measured fourth voltage is lower than a second threshold voltage.

7. The system for detecting leaks as recited in claim 1, wherein the first and second conductive elements comprise wires.

8. The system for detecting leaks as recited in claim 7, wherein each of the first and second conductive elements is covered with an electrically insulating and liquid absorbent material.

9. A method of detecting leaks, comprising the steps of:
a) providing a leak detection cable having first and second conductive elements, wherein each of the first and second conductive elements has opposed first and second ends, and wherein a diode electrically connects the first ends of the first and second conductive elements;
b) providing testing circuitry comprising a first capacitor in electrical communication with the second end of the first conductive element, and a second capacitor in electrical communication with the second end of the second conductive element;
c) electrically charging the second capacitor;
d) measuring a first voltage from the first conductive element;
e) determining that the diode has a first polarity and that the leak detection cable is connected when the measured first voltage from the first conductive element is greater than a first threshold voltage;
f) charging the first capacitor and subsequently measuring a second voltage from the second conductive element when the diode is determined not to have the first polarity;
g) determining that the diode has a second polarity and that the leak detection cable is connected when the measured second voltage from the second conductive element is greater than the first threshold voltage when the diode is determined not to have the first polarity;
h) determining that the leak detection cable is disconnected when the measured first and second voltages from the first and second conductive elements, respectively, are each less than the first threshold voltage;

i) electrically charging the first capacitor when the diode is determined to have the first polarity and the leak detection cable is determined to be connected;

j) measuring a third voltage from the first conductive element when the diode is determined to have the first polarity and the leak detection cable is determined to be connected;

k) determining that a leak exists when the measured third voltage from the first conductive element indicates that the first capacitor has discharged when the diode is determined to have the first polarity and the leak detection cable is determined to be connected;

l) electrically charging the second capacitor when the diode is determined to have the second polarity and the leak detection cable is determined to be connected;

m) measuring a fourth voltage from the second conductive element when the diode is determined to have the second polarity and the leak detection cable is determined to be connected;

n) determining that a leak exists when the measured fourth voltage from the second conductive element indicates that the second capacitor has discharged when the diode is determined to have the second polarity and the leak detection cable is determined to be connected; and o) returning to step c).

10. The method of detecting leaks as recited in claim 9, further comprising the step of generating a disconnection signal when the leak detection cable is determined to be disconnected in step h).

11. The method of detecting leaks as recited in claim 10, further comprising the step of generating a leak detection signal when the measured third voltage from the first conductive element indicates that the first capacitor has discharged in step k).

12. The method of detecting leaks as recited in claim 10, further comprising the step of generating a leak detection signal when the measured fourth voltage from the second conductive element indicates that the second capacitor has discharged in step n).

13. The method of detecting leaks as recited in claim 9, wherein it is determined that the first capacitor has discharged in step k) when the measured third voltage is lower than a second threshold voltage.

14. The method of detecting leaks as recited in claim 9, wherein it is determined that the second capacitor has discharged in step n) when the measured fourth voltage is lower than a second threshold voltage.

15. The method of detecting leaks as recited in claim 9, wherein the first and second conductive elements comprise wires.

16. The method of detecting leaks as recited in claim 15, wherein each of the first and second conductive elements is covered with an electrically insulating and liquid absorbent material.

* * * * *